(12) United States Patent
Matsumoto et al.

(10) Patent No.: US 11,346,983 B2
(45) Date of Patent: May 31, 2022

(54) OPTICAL THIN FILM AND MANUFACTURING METHOD OF OPTICAL ELEMENT

(71) Applicant: CANON KABUSHIKI KAISHA, Tokyo (JP)

(72) Inventors: Seiken Matsumoto, Utsunomiya (JP); Osamu Akutsu, Tokyo (JP); Kazuhiro Hoshino, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 724 days.

(21) Appl. No.: 15/923,100

(22) Filed: Mar. 16, 2018

(65) Prior Publication Data

US 2018/0306949 A1  Oct. 25, 2018

(30) Foreign Application Priority Data

Apr. 21, 2017  (JP) .............................. JP2017-084808

(51) Int. Cl.

| | |
|---|---|
| *G02B 1/115* | (2015.01) |
| *C03C 17/34* | (2006.01) |
| *C23C 14/06* | (2006.01) |
| *C23C 14/08* | (2006.01) |

(52) U.S. Cl.
CPC .......... *G02B 1/115* (2013.01); *C03C 17/3452* (2013.01); *C03C 2217/228* (2013.01); *C03C 2217/285* (2013.01); *C03C 2217/73* (2013.01); *C03C 2218/156* (2013.01); *C23C 14/0694* (2013.01); *C23C 14/08* (2013.01)

(58) Field of Classification Search
CPC . G02B 1/115; G02B 1/00; G02B 3/00; G02B 5/04; C03C 17/3452; C03C 2217/228; C03C 2217/285; C03C 2217/73; C03C 2218/156; C23C 14/0694; C23C 14/08
See application file for complete search history.

(56) References Cited

U.S. PATENT DOCUMENTS 4,927,239 A    5/1990  Melzig et al.
10,475,548 B2 * 11/2019  Guo ..................... H01L 31/1884
(Continued)

FOREIGN PATENT DOCUMENTS

CN   101019043 A   8/2007
CN   103221847 A   7/2013
(Continued)

OTHER PUBLICATIONS

First Office Action in Chinese Application No. 201810340346.4 (dated Apr. 14, 2020).
(Continued)

*Primary Examiner* — Nathan L Van Sell
(74) *Attorney, Agent, or Firm* — Venable LLP

(57) ABSTRACT

An optical thin film provided on a base substrate, includes a layer whose main component is ytterbium oxide, and a layer whose main component is magnesium fluoride. The layer whose main component is magnesium fluoride disposed on the layer whose main component is ytterbium oxide. The layer whose main component is magnesium
(Continued)

fluoride is positioned opposite from the base substrate with respect to the layer whose main component is ytterbium oxide.

16 Claims, 10 Drawing Sheets

(56) References Cited

U.S. PATENT DOCUMENTS

| | | | | |
|---|---|---|---|---|
| 2006/0291060 | A1* | 12/2006 | Shirai | G03F 7/70983 |
| | | | | 359/582 |
| 2007/0082224 | A1* | 4/2007 | Friz | C03C 17/2456 |
| | | | | 428/689 |
| 2012/0024362 | A1* | 2/2012 | Gossman | H01L 31/0481 |
| | | | | 136/255 |
| 2012/0208377 | A1* | 8/2012 | Timans | H01L 21/67115 |
| | | | | 438/799 |
| 2014/0077681 | A1* | 3/2014 | Brown | G02B 5/0808 |
| | | | | 313/111 |
| 2014/0327876 | A1 | 11/2014 | Hugenberg et al. | |
| 2015/0158775 | A1 | 6/2015 | Sun et al. | |
| 2016/0059605 | A1* | 3/2016 | Schmidt | B44C 1/165 |
| | | | | 428/216 |
| 2016/0313473 | A1 | 10/2016 | Akiba | |
| 2017/0190161 | A1* | 7/2017 | Wolk | H01L 33/46 |
| 2017/0200526 | A1* | 7/2017 | Guo | H01L 33/42 |

FOREIGN PATENT DOCUMENTS

| | | |
|---|---|---|
| EP | 1 804 087 A1 | 7/2007 |
| FR | 3 061 540 A1 | 7/2018 |
| JP | 60-502173 A | 12/1985 |
| JP | 2-96701 A | 4/1990 |
| JP | 3-242601 A | 10/1991 |
| JP | 7-84106 A | 3/1995 |
| JP | 9-291358 A | 11/1997 |
| JP | 10-123303 A | 5/1998 |
| JP | 2004-163549 A | 6/2004 |
| JP | 2005-70616 A | 3/2005 |
| JP | 2005-248276 A | 9/2005 |
| JP | 2006-519305 A | 8/2006 |
| JP | 2015-114599 A | 6/2015 |
| KR | 20-0354762 Y1 | 7/2004 |
| WO | 00/33111 A1 | 6/2000 |
| WO | 02/14930 A1 | 2/2002 |

OTHER PUBLICATIONS

Extended European Search Report in European Application No. 18164075.6 (dated Aug. 31, 2018).

Notification of Reasons for Refusal in Japanese Application No. 2017-084808 (dated Feb. 2021).

* cited by examiner

OPTICAL THIN FILM AND MANUFACTURING METHOD OF OPTICAL ELEMENT

BACKGROUND OF THE INVENTION

Field of the Invention

The present invention relates to an optical thin film for use as an antireflection film. The optical thin film can be suitably used for an optical element such as a lens and a prism.

Description of the Related Art

Hitherto, there is known a multilayer film in which high refractive index layers and low refractive index layers are alternately laminated as an antireflection film used for an optical element such as a lens. It is noted that the multilayer film will be referred to as an optical thin film in the following description.

Magnesium fluoride ($MgF_2$) is known as a material of the low refractive index layer disposed on an air-side among the layers composing the optical thin film. A sputtering process is drawing an attention as a method for forming magnesium fluoride film. While the sputtering process is a method for forming a film by atomizing and flying a material by utilizing charged particles such as plasma, this process excels, as compared to a vacuum deposition method, in that reproducibility and controllability of a film thickness are high and in that film-forming temperature is low.

Although the sputtering process has the above-mentioned merits, it is difficult to control a reaction of a sputtering material and a underlaying material with fluorine in forming a film of fluoride and to control damages caused by charged particles. In particular, in a case where an antireflection film composed of fluoride is to be formed on a glass substrate or an oxide film, there is a case where an altered layer having electronic defects is formed because the glass substrate or the oxide film is reduced by fluorine atoms with strong oxidizing properties that are incident around an interface with a base. Due to that, there is a case where optical absorption occurs on a wavelength side longer than a wavelength corresponding to an original bandgap, and optical characteristic becomes unfavorable as the antireflection film.

Japanese Patent Application Laid-open No. 2015-114599 discloses an optical thin film in which a magnesium oxyfluoride film is formed between an oxide film composed of a high refractive index material and a magnesium fluoride film which is a low refractive index material in order to suppress optical absorption that occurs around the interface between the oxide film and magnesium fluoride film.

While the optical absorption caused at the interface can be suppressed in a case of the optical thin film in which the magnesium oxyfluoride film is formed between the oxide film and the magnesium fluoride film, there is a possibility that the magnesium fluoride is delaminated under a high-temperature and high-humidity environment. In a case where a rate of oxygen within the magnesium oxyfluoride film is increased in particular, its physical property becomes closer to water soluble magnesium oxide, so that the magnesium fluoride film tends to be delaminated under the high-humidity environment.

Accordingly, it has been demanded to realize an optical thin film that can suppress the optical absorption around the interface with the high refractive index material of the base and that has high durability under the high-temperature and high-humidity environment while using magnesium fluoride, i.e., the low refractive index material.

SUMMARY OF THE INVENTION

According to a first aspect of the present invention, an optical thin film provided on a base substrate, includes a layer whose main component is ytterbium oxide, and a layer whose main component is magnesium fluoride disposed on the layer whose main component is ytterbium oxide. The layer whose main component is magnesium fluoride is positioned opposite from the base substrate with respect to the layer whose main component is ytterbium oxide.

According to a second aspect of the present invention, a manufacturing method of an optical element in which a multilayer film is provided on a base substrate includes forming a layer whose main component is ytterbium oxide by a sputtering process, and forming a layer whose main component is magnesium fluoride by a sputtering process on the layer whose main component is ytterbium oxide.

Further features of the present invention will become apparent from the following description of exemplary embodiments with reference to the attached drawings.

DESCRIPTION OF THE EMBODIMENTS

An optical thin film of an embodiment of the present disclosure and a manufacturing method thereof will be described below with reference to the drawings.

Optical Thin Film

The optical thin film of the embodiment of the present disclosure has an antireflection function and is applicable to various optical elements and optical members including a lens, a mirror, a prism, a filter and a diffraction grating. The optical thin film can be suitably used for a lens whose material is glass or plastic in particular. There will be case where the optical element or the optical member on which the optical thin film is to be provided is referred to as a 'base substrate' in the following description.

The optical thin film of the embodiment is a thin film in which a plurality of layers is laminated and includes a part in which a magnesium fluoride layer and a ytterbium oxide layer are provided adjacent with each other in this order in a view on a side opposite from the base substrate, i.e., from an atmosphere-side. It is noted that although the term 'atmosphere-side' has used for convenience of the description, it does not mean to prohibit placing the optical thin film of the present disclosure in an environment differing from the regular atmosphere.

Figure 1:
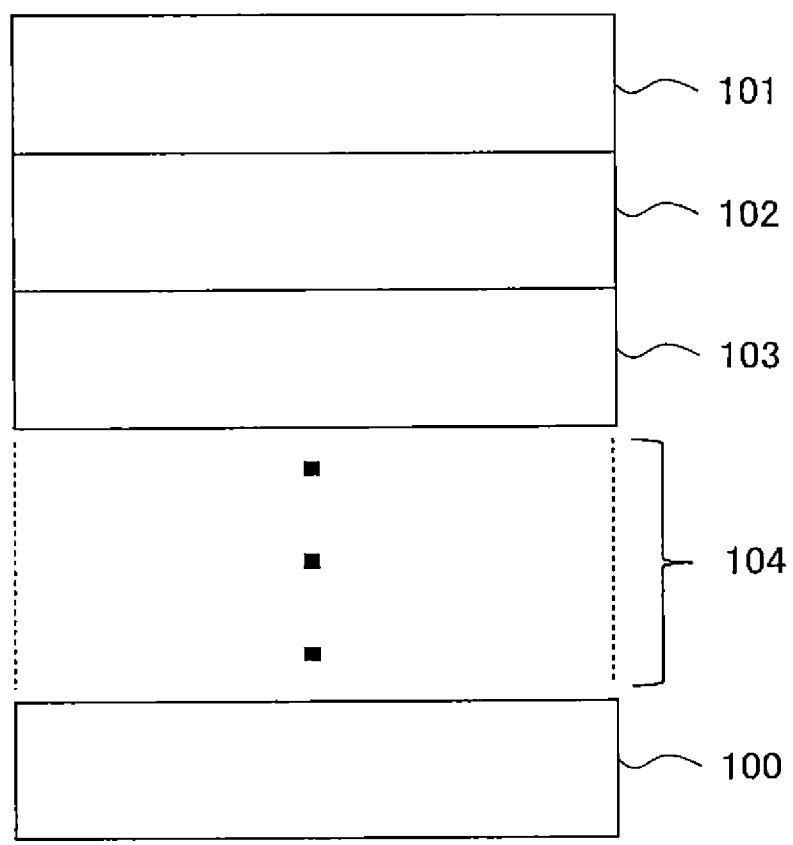
FIG. 1 is a schematic section view illustrating a configuration of an optical thin film of an embodiment.

FIG. 1 is a schematic section view illustrating a laminating configuration of the optical thin film of the embodiment of the present disclosure. As illustrated in FIG. 1, an alternating layer 104 in which high refractive index layers and low refractive index layers are alternately laminated, a silicon oxide layer 103, an ytterbium oxide layer 102, and a magnesium fluoride layer 101 are provided on the base substrate 100 sequentially from the base substrate side.

Because magnesium fluoride is one of materials whose refractive index is lowest among materials that can be used as an optical film, the magnesium fluoride layer 101 is used as an uppermost layer, i.e., a surface layer that is in contact with air, in the embodiment illustrated in FIG. 1. However, the embodiment of the present disclosure is not necessarily limited to the case where the magnesium fluoride layer is disposed as the atmosphere-side uppermost layer. Still further, the magnesium fluoride layer is not limited to be provided as only one layer and a plurality of magnesium fluoride layers may be provided within the multilayer film. The magnesium fluoride layer is a layer containing magnesium fluoride ($MgF_2$) as a main component and is preferable to be a layer containing magnesium fluoride by 80 wt. % or more or preferably to be a layer containing magnesium fluoride by 90 weight % or more. It is noted that because the magnesium fluoride layer 101 is formed by sputtering as described later, there is a case where the magnesium fluoride layer 101 contains argon within the layer. Refractive index of the magnesium fluoride layer is desirable to be 1.40 or less with respect to light of 550 nm of wavelength.

According to the optical thin film of the embodiment of the present disclosure, the ytterbium oxide layer is provided as a base of magnesium fluoride layer. The ytterbium oxide layer is a layer containing ytterbium oxide ($Yb_2O_3$) as a main component and is preferable to contain ytterbium oxide by 80 wt. % or more.

The ytterbium oxide layer is used as the base of the magnesium fluoride layer because ytterbium oxide is a material whose reducibility is low and is hardly reduced even if fluorine atoms with strong oxidizing properties are incident on the base in forming the magnesium fluoride layer by the sputtering process. Due to that, electronic defect is hardly formed and optical absorption is suppressed. Still further, even if fluorine bonds with ytterbium and the interface of the layer is altered as ytterbium fluoride, the layer will not be delaminated even under a high-humidity environment because the layer is solid and is insoluble. That is, it is possible to effectively suppress the optical absorption at the interface and the delamination under the high-humidity environment by using the ytterbium oxide layer as the base layer of the magnesium fluoride layer formed by the sputtering process.

In the embodiment illustrated in FIG. 1, the ytterbium oxide layer 102 is disposed right under the magnesium fluoride layer 101. Refractive index of the ytterbium oxide layer 102 is typically 1.91. It is noted that the ytterbium oxide layer 102 may contain argon within the layer because the ytterbium oxide layer 102 is formed by the sputtering process as described later.

In the optical thin film of the embodiment of the present disclosure, it is desirable to provide a dielectric layer whose main component is silicon compound such as silicon oxide, silicon oxynitride, and silicon nitride. For instance, in the embodiment illustrated in FIG. 1, the silicon oxide layer 103 is provided as the base layer of the ytterbium oxide layer 102.

It is because if the ytterbium oxide layer is formed right above a high refractive index layer mainly composed of niobium oxide for example, bubble-like defects occur across the whole surface. When a section of the film was observed by a transmission electronic microscope, it was confirmed that voids are generated at an interface of the ytterbium oxide layer with the niobium oxide layer. While such voids are generated due to strong stress, it is desirable to provide the dielectric layer composed of the silicon compound such as the silicon oxide layer as the base layer right under the ytterbium oxide layer in order to prevent such defects.

In the case where the ytterbium oxide layer 102 is formed right above the silicon oxide layer 103, the optical thin film excels not only in the antireflection characteristics but also effectively suppresses the occurrence of the defects because the low refractive index layers and the high refractive index layers are alternately disposed.

In the optical thin film of the embodiment of the present disclosure, it is desirable to provide an alternating layer in which the high refractive index layers and the low refractive index layers are alternately laminated between the base substrate and the ytterbium oxide layer or between the base substrate and the dielectric layer composed of the silicon compound. Then, the alternating layer 104 in which the high refractive index layers and the low refractive index layers are alternately laminated is provided between the base substrate 100 and the silicon oxide layer 103 in the embodiment illustrated in FIG. 1.

For the low refractive index layer included in the alternating layer 104, a low refractive index material whose refractive index is 1.35 or more and less than 1.75 can be used. More specifically, silicon oxide, silicon oxynitride, aluminum oxide or the like can be used as the low refractive index material.

For the high refractive index layer included in the alternating layer 104, a material whose refractive index is 1.75 or more and 2.7 or less can be used. More specifically, zirconium oxide, tantalum oxide, niobium oxide, titanium oxide, silicon nitride, silicon oxynitride or the like can be used as the high refractive index material.

It is noted that in the embodiment illustrated in FIG. 1, it is suitable to dispose the high refractive index layer as the uppermost layer of the alternating layer 104. It is advantageous in terms of the antireflection characteristics to provide the high refractive index layer as the uppermost layer of the alternating layer 104 because the silicon oxide layer 103 is disposed right above the alternating layer 104 and the silicon oxide layer 103 has low refractive index.

As described above, not the material of the low refractive index layer of the alternating layer, i.e., silicon oxide, silicon oxynitride, aluminum oxide or the like, but ytterbium oxide is used, as the material of the base layer right under the magnesium fluoride layer in the present embodiment. Due to that, fluorine atom with strong oxidizing properties does not bond with the material of the base layer and no fluoride is formed on the interface in forming the magnesium fluoride layer. Accordingly, no silicon oxide or no silicon oxynitride will be altered into gaseous silicon fluoride, and the film will not tend to be delaminated from that part. Still further, no aluminum oxide will be altered into soluble aluminum fluoride, and the film will not tend to be delaminated in a high-humidity environment.

Still further, according to the present embodiment, not the material of the high refractive index layer of the alternating layer, i.e., tantalum oxide, niobium oxide, titanium oxide, zirconium oxide or the like, but ytterbium oxide is used as the material of the base layer right under the magnesium fluoride layer. Therefore, no altered layer having electronic defects otherwise caused by fluorine atom with strong oxidizing properties will be formed in forming the magnesium fluoride layer. Accordingly, no optical absorption occurs on a wavelength-side longer than the wavelength corresponding to a bandgap around the interface with the base. Still further, no zirconium oxide will be fluorinated as water-soluble zirconium fluoride, and the film will not tend to be delaminated when the film is placed under the high-humidity environment.

As described above, the optical thin film of the present embodiment is a laminated body in which the magnesium fluoride layer 101 is disposed as a first layer and the ytterbium oxide layer 102 as a second layer in a view from the atmosphere-side. Still further, preferably the silicon oxide layer 103 is disposed as a third layer in a view from the atmosphere-side. The alternating layer 104 in which the high refractive index layers and low refractive index layers are alternately disposed is disposed between the base substrate and the abovementioned three layers corresponding to the antireflection performance.

Manufacturing System and Manufacturing Method of Optical Thin Film

An overall configuration and functions of a sputtering system 200 suitably used for manufacturing the optical thin film of the present embodiment will be described with reference to FIG. 2. It is noted that there is a case where individual steps for forming the respective layers in forming the optical thin film by sequentially laminating the plurality of layers is referred to as a 'film-forming process' for convenience.

The sputtering system 200 is what forms the multilayer film by sputtering on a base substrate 231, i.e., an object of the film-forming process, and includes a vacuum chamber 210 and a holder 232 configured to hold the base substrate 231 within the vacuum chamber 210. The sputtering system 200 also includes a cathode mechanism 222 configured to support a target 221 such that the target 221 faces the base substrate 231 within the vacuum chamber 210.

While a DC magnetron-type cathode mechanism 222 using a permanent magnet is used in the present embodiment, an RF (high-frequency) discharge type mechanism or a DC discharge type mechanism not using magnetism may be also used for the cathode mechanism 222.

The holder 232 is disposed at the position facing the target 221 within the vacuum chamber 210. The base substrate 231, i.e., the object onto which the film is to be formed, is attachably/detachably held by the holder 232. A glass lens is used as the base substrate 231 in the present embodiment.

A glass up to 250 mm in diameter and 100 mm in thickness is used for example as the base substrate 231. Synthetic silica or S-BSL7 (all glass materials exemplified hereinafter are manufactured by OHARA Inc.) and the like is used as a glass material of the base substrate 231. The base substrate is held by the mechanism not illustrated such that the base substrate can be turned in forming the film. The sputtering system 200 is configured such that a plurality of base substrates 231 can be set simultaneously as long as size of the base substrate 231 falls within a range of the abovementioned size, and the plurality of base substrates is held so as to revolve in such a case.

Figure 2:
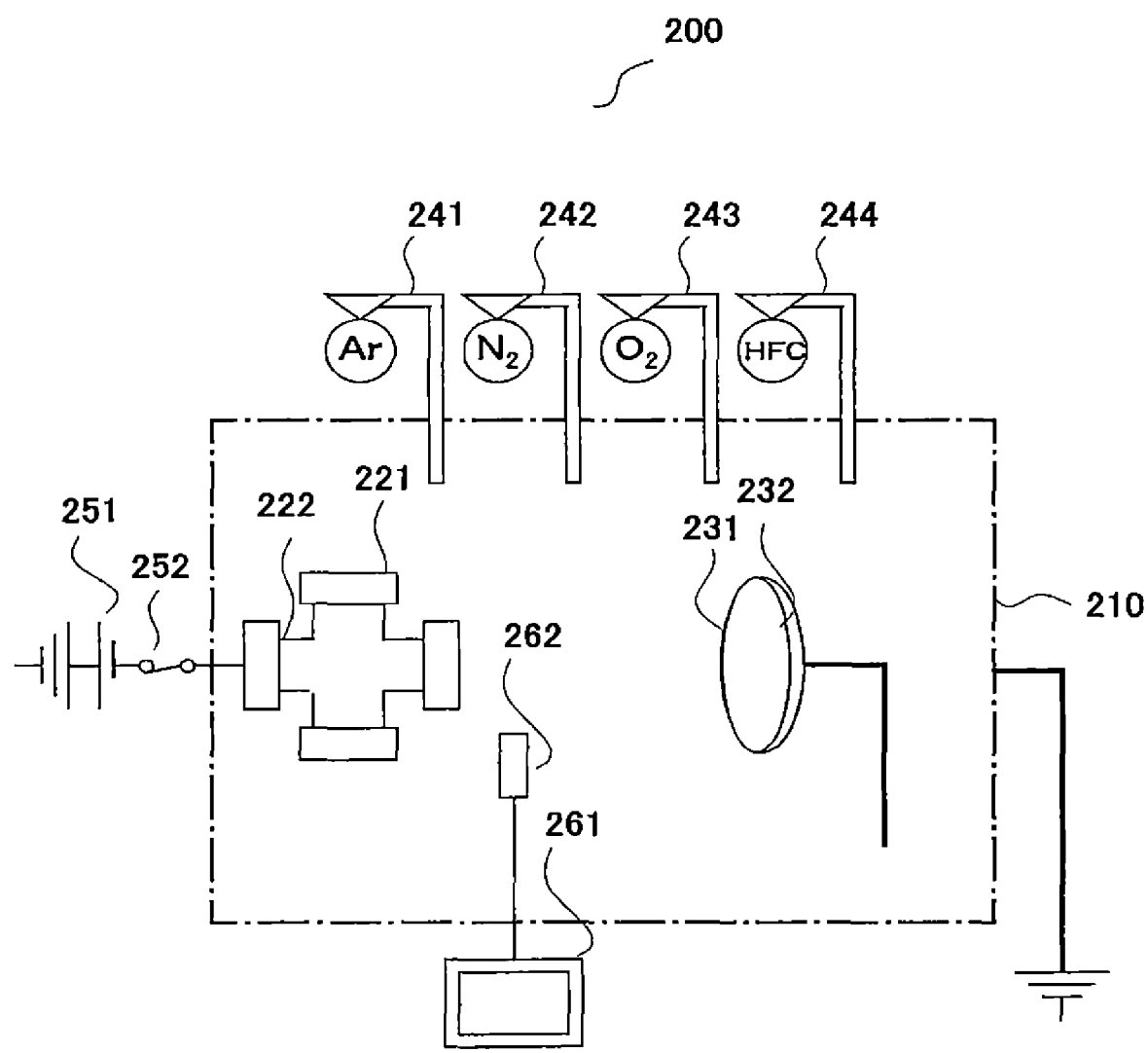
FIG. 2 is schematic view illustrating a configuration of a film-forming apparatus for manufacturing the optical thin film of the embodiment.

While the base substrate 231 may be disposed so as to confront to the target 221 as illustrated in FIG. 2, a distance to the target 221 and an angle may be appropriately changed corresponding to a film-forming rate and to a control on a distribution of film thickness.

The optical thin film formed on the lens glass, i.e., the base substrate 231, is a multi-layered antireflection film containing the magnesium fluoride layer and the ytterbium oxide layer. The optical thin film may further include a layer selected from zirconium, tantalum oxide, niobium oxide, titanium oxide, silicon nitride, silicon oxynitride, aluminum oxide and the like.

The cathode mechanism 222 within the vacuum chamber 210 is connected with a DC power source 251 that can apply high voltage through a power supply switch 252 that is switched and controlled by a control portion. A cathode electrode of the DC power source 251 is connected to the power supply switch 252 side and an anode electrode thereof is earthed. The target 221 is attachably/detachably mounted to the cathode mechanism 222. A plurality of the targets 221 can be mounted simultaneously to the cathode mechanism 222, though it depends on a shape of the cathode mechanism 222. Four targets are mounted to the cathode mechanism 222 in FIG. 2, and at least four kinds of materials can be formed by switching the materials during the film-forming process.

In a condition in which air is evacuated by a vacuum pump not illustrated and a predetermined degree of vacuum is kept, inert gas such argon and reactive gases such as nitrogen, oxygen and fluorine are introduced through inlet ports 241, 242, 243 and 244.

The vacuum chamber 210 is connected with a plasma emission monitor 261 to be able to monitor a condition of the plasma. An emission obtaining portion 262 configured to condense the light emission of the plasma is disposed within the vacuum chamber 210 to be able to introduce the light emission to the plasma emission monitor 261 through an optical fiber. The plasma emission monitor 261 is composed of a wavelength selecting portion and a light receiving portion not illustrated. The plasma emission monitor 261 is configured such that the light is divided by a diffraction grating or the like of a spectroscope serving as the wavelength selecting portion and such that intensity of the emission can be obtained as an electrical signal per predetermined wavelength by a CCD or the like serving as the light receiving portion. Besides them, the emission obtaining portion 262 may be configured so as to select a predetermined wavelength by using a bandpass filter (BPF) as the wavelength selecting portion and to obtain the intensity of the emission by a light receiving portion of a photomultiplier (PMT) or the like.

The power supply switch 252 is switched and controlled by the control portion in the sputtering system 200 constructed as described above. A plasma is generated above the target 221 mounted on the cathode mechanism 222 connected with the DC power source 251. The film-forming on the base substrate 231 held by the holder 232 is thus started by sputtering the target within the vacuum chamber 210.

Then, ions within the plasma collide against the target 221 held at the cathode, and silicon atoms are sputtered out if the target is silicon target. The silicon atoms bond with oxygen and nitrogen of the reactive gas within the plasma, become silicon oxide, silicon nitride and silicon oxynitride, and adhere to the base substrate 231 so as to form a layer.

Each control element of the sputtering system 200 serving as the film-forming apparatus is connected with a computer not illustrated and serving as the control portion. This computer makes it possible to control the sputtering system 200 collectively. A program for carrying out the sputtering for manufacturing the optical thin film of the present embodiment is stored in the control portion.

In forming the film, the gases are introduced through the various gas inlet ports 241, 242, 243 and 244 of the vacuum chamber 210. For instance, in a case where argon 241 and oxygen 243 are introduced, a silicon oxide film is formed, and in a case where argon 241 and nitrogen 242 are introduced, a silicon nitride film is formed. That is, only appropriately selected reactive gases may be introduced corresponding to a target film to be formed. Because argon is introduced, argon is confirmed to exist within the layer by spectroscopy such as energy dispersed X-ray spectroscopy and the like performed simultaneously with an observation of a cross section by a transmission electronic microscope. However, because argon is inert gas, it affects nothing on the antireflection characteristics. It is a characteristic point of the film-forming process by using the sputtering system that the layer contains argon within the layer.

Figure 3:
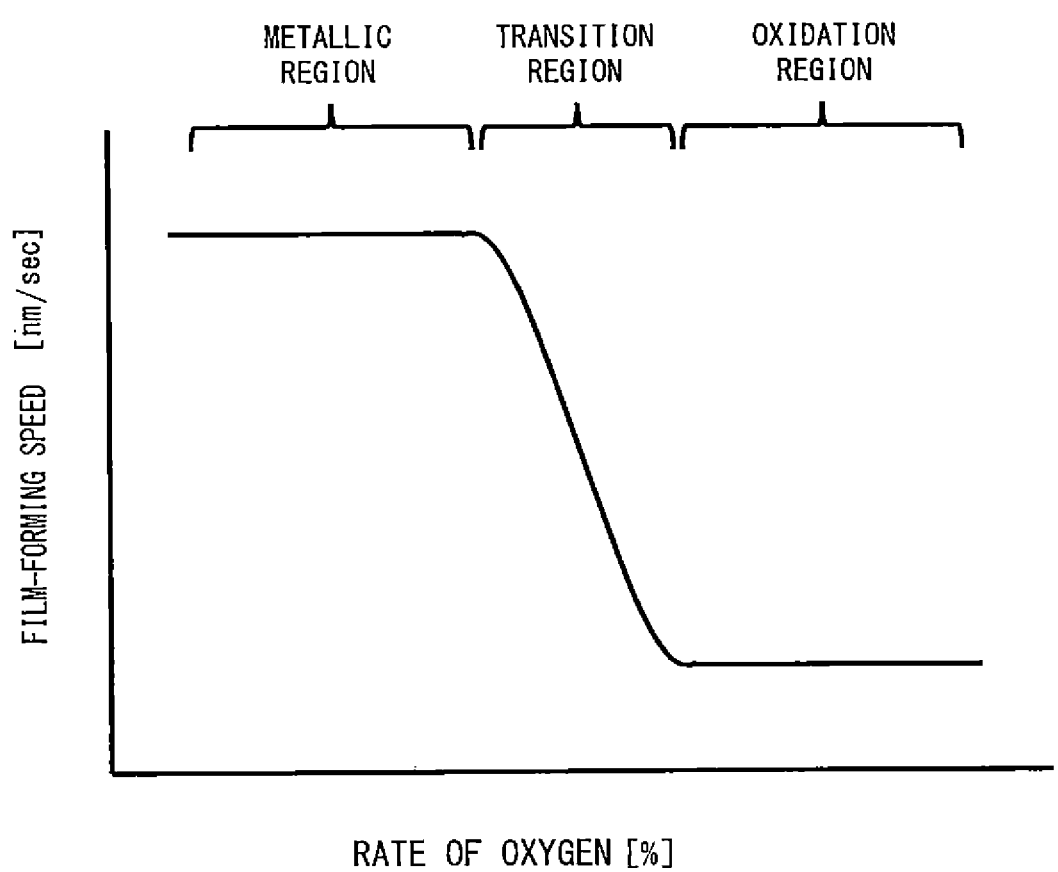
FIG. 3 is a chart illustrating changes of a film-forming condition related with a rate of oxygen.

FIG. 3 is a chart indicating a relationship between a rate of oxygen to the gases introduced into the chamber and a film-forming condition, i.e., film-forming speed. As illustrated in FIG. 3, it is possible to roughly divide the film-forming condition as a metallic region, a transition region and an oxidation region by the rate of the oxygen gas to the whole gases introduced in forming the film. An axis of abscissa of the chart represents the rate of oxygen, and an axis of ordinate represents the film-forming speed.

A region in which the rate of oxygen is low and the film-forming speed is constant will be referred to as the metallic region, a region in which the rate of oxygen is high and the film-forming speed is constant will be referred to as the oxidation region, and a region in which the rate of oxygen is intermediate between those regions and the film-forming speed changes sharply will be referred to as the transition region. The film can be formed with the constant speed in the metallic region and in the oxidation region by adjusting the rates of oxygen to be fully low or to be fully high.

In the transition region, the film-forming speed fluctuates with a slight change of the rate of oxygen. Therefore, in order to form the film in the transition region, a gas flow rate is controlled and set so as to keep spectrum intensity constant by monitoring emission spectra intrinsic to the target 221 and to the reactive gas by using the plasma emission monitor 261.

In the present embodiment, the optical thin film is formed by using the oxidation region and/or the transition region. Electric power inputted to the target 221 is 5 kW for example by the DC power source 251. High frequency of 100 KHz order may be superimposed as necessary in order to stabilize the electric discharge. While the film thickness is controlled by measuring the film-forming time by the control portion, a film thickness monitor may be used.

The process conditions such as the type of the gas, the flow rate, and the inputted electric power as described above may be appropriately changed depending on a material and desirable film quality.

First Embodiment

Figure 4:
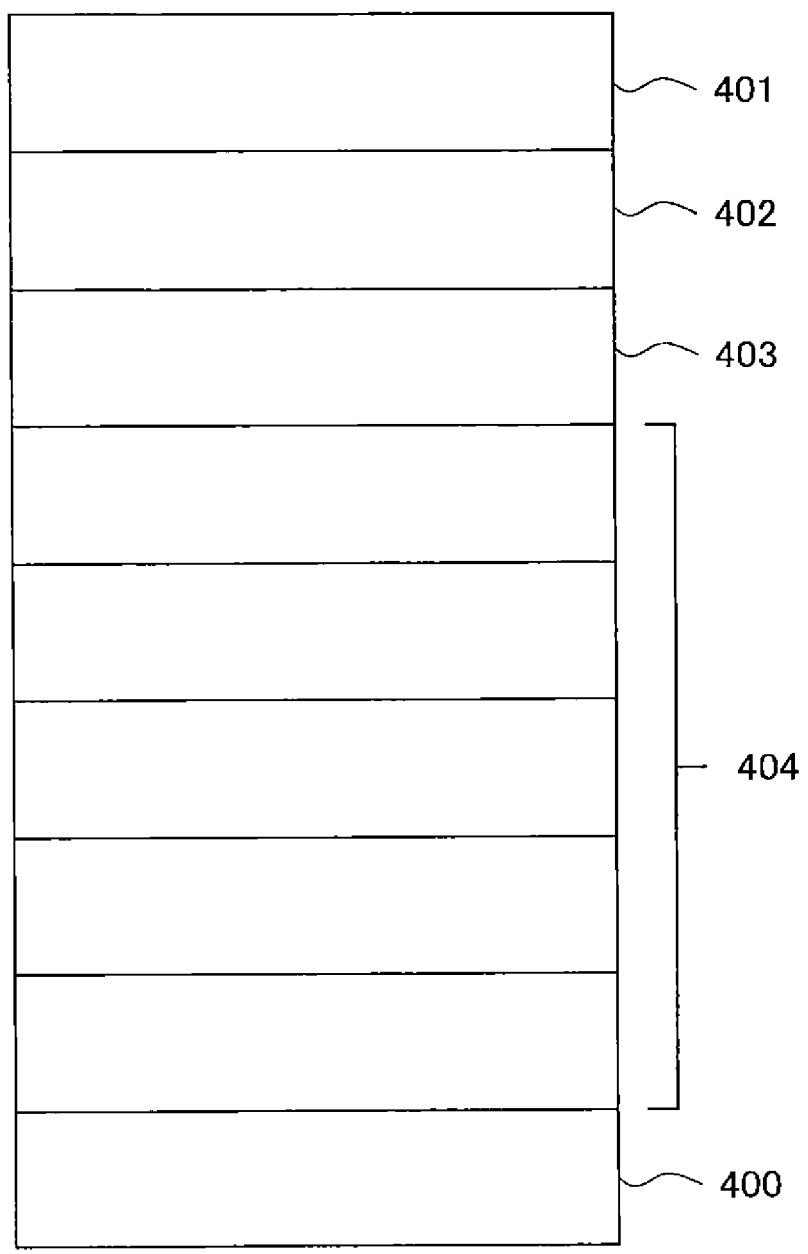
FIG. 4 is a schematic section view illustrating a configuration of an optical thin film of a first embodiment.

FIG. 4 is a schematic section view illustrating the configuration of the optical thin film of a first embodiment. As illustrated in FIG. 4, an alternating layer 404, a silicon oxide layer 403, an ytterbium oxide layer 402 and a magnesium fluoride layer 401 are disposed on a base substrate 400 sequentially from the base substrate 400. The alternating layer 404 includes five in total of layers of the high refractive index layers and low refractive index layers alternately disposed. It is noted that while the alternating layer 404 is composed of the five layers in the present embodiment, the number of layers and the film thickness can be appropriately changed in order to obtain a desirable antireflection performance.

Although the synthetic silica is used for the base substrate 400 in the first embodiment, a borosilicate crown glass material (manufactured by OHARA Ltd.: S-BSL7) or a fluorine crown glass material (same: S-FSL5) into which ordinary additives are introduced can be used.

Still further, while the flat glass plate is used as the base substrate 400 in the first embodiment, the base substrate may have a shape other than the flat plate depending on a type of the optical element onto which the optical thin film is to be formed. For instance, in a case where the optical element is a lens, the base substrate may include a concave or convex curved surface and in a case where the optical element is a prism, the base substrate may have a polygonal columnar shape for example. In a case where the optical element is a mirror or a filter, the flat plate may be used like the present embodiment.

At first, a niobium oxide layer having a high refractive index is formed on the base substrate 400 and then a silicon oxide layer having a low refractive index and a niobium oxide layer having a high refractive index are alternately formed by using the sputtering system illustrated in FIG. 2. That is, the alternating layer 404 composed of the five layers in total is formed on the base substrate 400.

The niobium oxide layer is formed under conditions of: introduction of 700 sccm of argon gas and 100 sccm of oxygen gas, 0.23 Pa of pressure, and 5.5 kW of power supply. The silicon oxide layer is formed under conditions of: introduction of 70 sccm of argon gas and 90 sccm of oxygen gas, 0.21 Pa of pressure, and 5.5 kW of power supply. While the layers are formed under the forming condition of the oxidation region, the layers may be also formed in the transition region.

Because the uppermost layer of the alternating layer 404 is the niobium oxide layer having a high refractive index, the silicon oxide layer 403, i.e., the third layer from the atmosphere-side, is formed thereon. Although the film-forming condition may be the same with that of the silicon oxide layer of the alternating layer 404, a film thickness is preferable to be 3 nm or more and 20 nm or less. It is because it is desirable to suppress the thickness to be 20 nm or less in order to maintain the antireflection performance. It is more desirable to keep the thickness to be 15 nm or less if a still higher antireflection performance is desirable. Still further, if the thickness is 3 nm or less, it becomes hard to obtain a barrier effect for insulating the ytterbium oxide layer 402 from the niobium oxide layer and it becomes difficult to control the thickness in forming the film. Accordingly, the thickness of the silicon oxide layer 403 is desirable to be 3 nm or more in order to suppress the bubble-like defects from being generated under a high-humidity environment.

Next, the ytterbium oxide layer 402, i.e., the second layer from the atmosphere-side, is formed on the silicon oxide layer 403. The ytterbium oxide layer 402 is formed under conditions of: introduction of 70 sccm of argon gas and 60 sccm of oxygen gas, 0.18 Pa of pressure, and 3 kW of power supply.

This condition corresponds to the film-forming condition in the oxidation region. Although it is also possible to form the layer in the transition region as described later in a second embodiment, it is suitable to form the layer in the oxidation region in order to reduce optical absorption occurring at the interface with the magnesium fluoride layer. Then, a thickness of the ytterbium oxide layer 402 is desirable to be 3 nm or more in order to suppress the optical absorption occurring at the interface, to keep a delamination preventing function under a high-humidity environment, and to keep readiness of the control on the film thickness of the film-forming apparatus. Still further, the thickness of the ytterbium oxide layer 402 is desirable to be 15 nm or less in order to achieve the antireflection performance and to suppress a drop of productivity otherwise caused by prolongation of time required for forming the layer.

Next, the magnesium fluoride layer 401, i.e., the first layer from the atmosphere-side, is formed on the ytterbium oxide layer 402. The magnesium fluoride layer 401 is formed under conditions of: introduction of 100 sccm of argon gas, 15 sccm of freon gas containing fluorine (HFC), and 30 sccm of oxygen gas, 0.4 Pa of pressure, and 6 kW of power supply. While the film-forming condition described above corresponds to the conditions in the oxidation region, it is also possible to form the layer in the transition region.

Table 1 indicates the concrete thicknesses of the respective layers formed under the abovementioned film-forming conditions.

TABLE 1

| LAYER | MATERIAL | THICKNESS [nm] |
|---|---|---|
| 401 | MAGNESIUM FLUORIDE | 70 |
| 402 | YTTERBIUM OXIDE | 15 |
| 403 | SILICON OXIDE | 10 |
| 404 | NIOBIUM OXIDE | 28 |
|  | SILICON OXIDE | 23 |
|  | NIOBIUM OXIDE | 36 |
|  | SILICON OXIDE | 42 |
|  | NIOBIUM OXIDE | 11 |
| 400 | SYNTHETIC SILICA | BASE SUBSTRATE |

While the thicknesses of the respective layers may be set arbitrarily, the thicknesses of the ytterbium oxide layer 402 and the silicon oxide layer 403 are set within the range of 5 nm or more and 20 nm or less as described above. Still further, the alternating layer 404 in which the high refractive index layer of the niobium oxide layer and the low refractive index layer of the silicon oxide layer are alternately provided needs not be always composed of five layers.

After forming the optical thin film of the first embodiment, assessments of the optical absorption and tests in a high-temperature and high-humidity environment were carried out.

The assessment of the optical absorption was carried out by measuring transmissivity and reflectivity in a wavelength range of 400 to 700 nm with 5 degrees of incident angle by using a spectrophotometer U-4100 manufactured by Hitachi High-technologies Inc. The optical absorption was calculated by reducing a percentage of the transmissivity and a percentage of the reflectivity from 100%. While a calculated value indicates a whole film loss including also scattering in a strict sense, it is recorded as absorption because the scattering caused by a surface of the film and roughness of an interface is a negligible level in this wavelength range.

Figure 5:
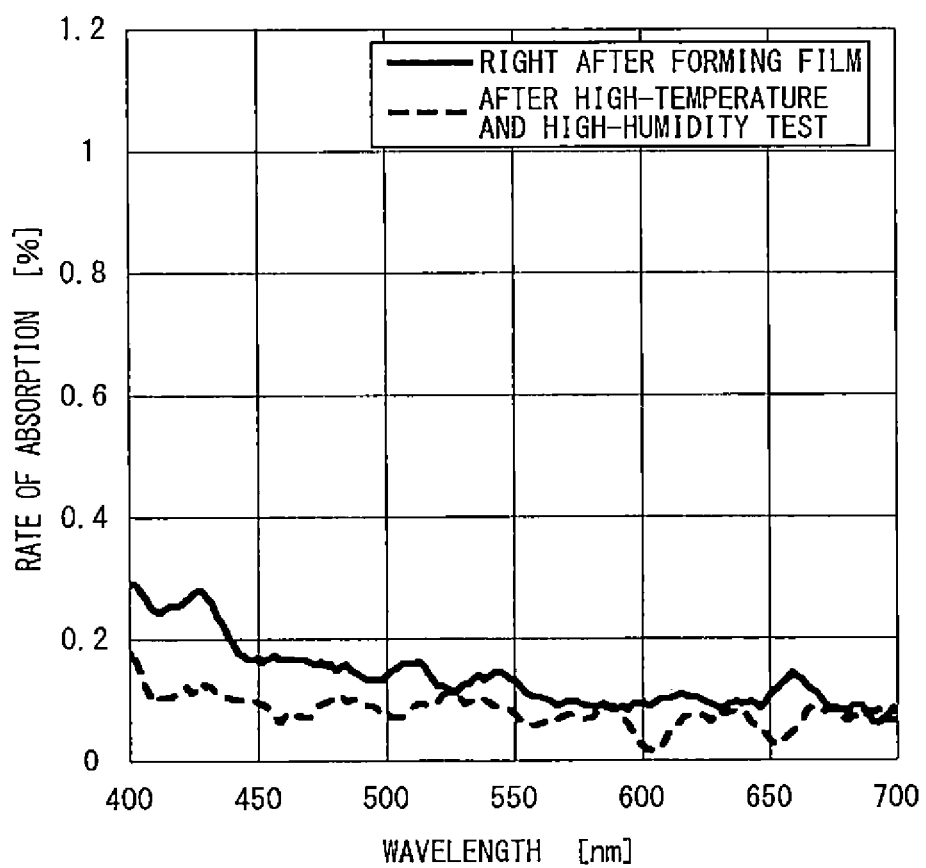
FIG. 5 is a chart indicating a relationship between optical absorptance and wavelength before and after a high-temperature and high-humidity test of the optical thin film of the first embodiment.

FIG. 5 is a chart indicating wavelength dependency of the absorptance. An axis of abscissa of the chart represents the wavelength and an axis of ordinate represents the absorptance. A solid line indicates a result right after forming the film and a broken line indicates a result after a high-temperature and high-humidity test. The both have favorable absorptance of lower than 0.2% at 450 nm of wavelength.

The test under the high-temperature and high-humidity environment was carried out from several hundred to several thousand hours by using a small environment tester SH-221 manufactured by Espec Inc. and by setting temperature and humidity corresponding to an acceleration test. After that, when an appearance of the film was evaluated by eyes and by using an optical microscope, no delamination was confirmed. Still further, the film was not delaminated even if an abrasion test to the film and a wipe-off test by solvent were conducted, and thus it was confirmed that a favorably film had been formed.

Second Embodiment

While the ytterbium oxide layer 402 was formed in the oxidation region in the first embodiment, the ytterbium oxide layer 402 is formed in the transition region in the second embodiment. The ytterbium oxide layer is formed under conditions of: introduction of 140 sccm of argon gas and 0.35 Pa of pressure. Then, an oxygen gas flow rate was controlled so as to keep a peak value at 346 nm of wavelength to 20000 in terms of emission intensity obtained from the plasma emission monitor 261. The alternating layer 404, the silicon oxide layer 403 and the magnesium fluoride layer 401 are formed in the same manner with the first embodiment.

Comparison of First and Second Embodiments

Figure 6:
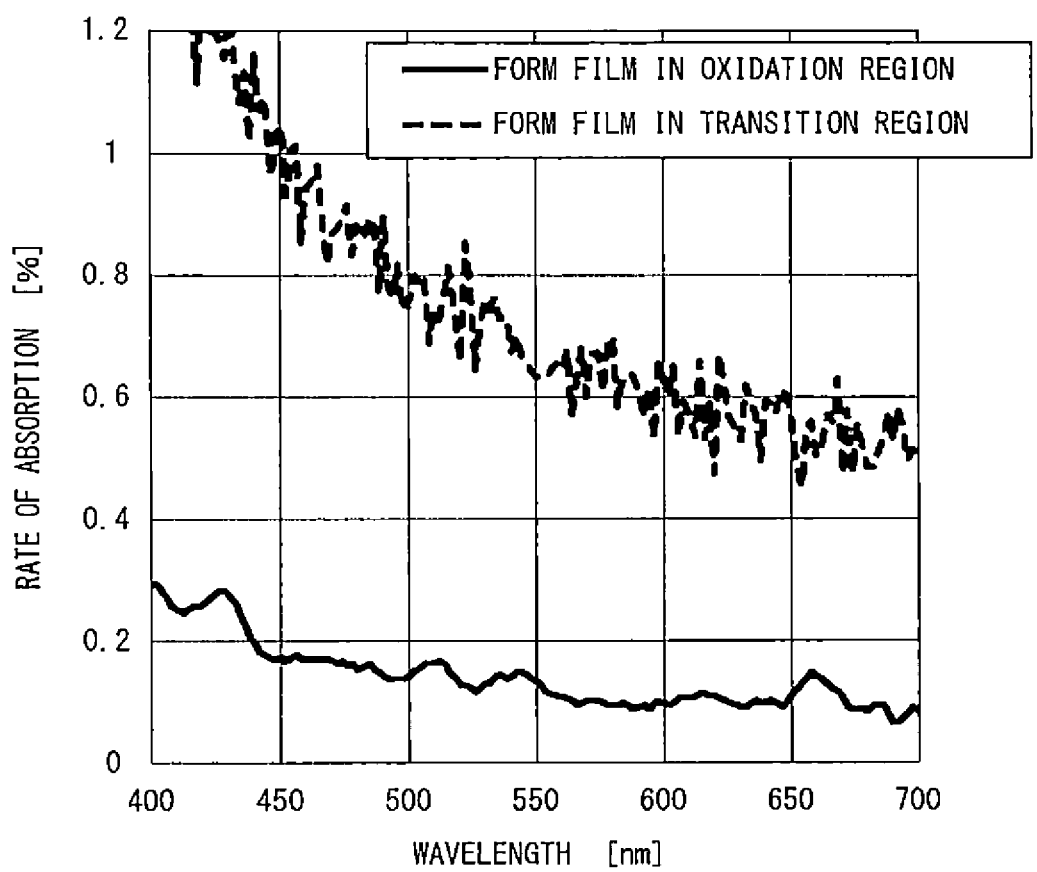
FIG. 6 is a chart indicating a relationship between optical absorptance and wavelength of the optical thin film of the first embodiment and an optical thin film of a second embodiment.

FIG. 6 is a chart indicating a comparison result of the wavelength dependency of the optical absorptance of the first embodiment in which the ytterbium oxide layer 402 is formed in the oxidation region and of the second embodiment in which the ytterbium oxide layer 402 is formed in the transition region. An axis of abscissa of the chart represents the wavelength and an axis of ordinate represents the optical absorptance. A solid line indicates a result of forming the layer in the oxidation region, and a broke line indicates a result of forming the layer in the transition region. In the case where the layer is formed in the oxidation region, the optical absorption is favorable as it is lower than 0.2% at 450 nm of wavelength. In the case where the layer is formed in the transition region, the optical absorption is around 1%. It can be seen that it is possible to obtain the multilayer film that excels in the optical characteristics by forming the layer in the oxidation region like the first embodiment. It is found from an analyzing test that it is because more optical absorptions occur at the interface of the ytterbium oxide layer 402 formed in the transition region with the magnesium fluoride layer 401.

In order to verify differences of structures in the cases where the ytterbium oxide layer is formed in the oxidation region and in the transition region, crystallinity was analyzed by using X-ray diffraction on the multilayer film of the first embodiment and on the multilayer film of the second embodiment. Still further, in order to more clearly compare structural differences of the ytterbium oxide layers, two kinds of monolayer samples in which the ytterbium oxide layers of 100 nm thick formed respectively in the oxidation region and the transition region on the silica glass substrates are also prepared. The X-ray diffraction was measured with an In-Plane XRD method by using an X-ray diffractometer ATX-G manufactured by Rigaku Ltd.

Figure 7A:
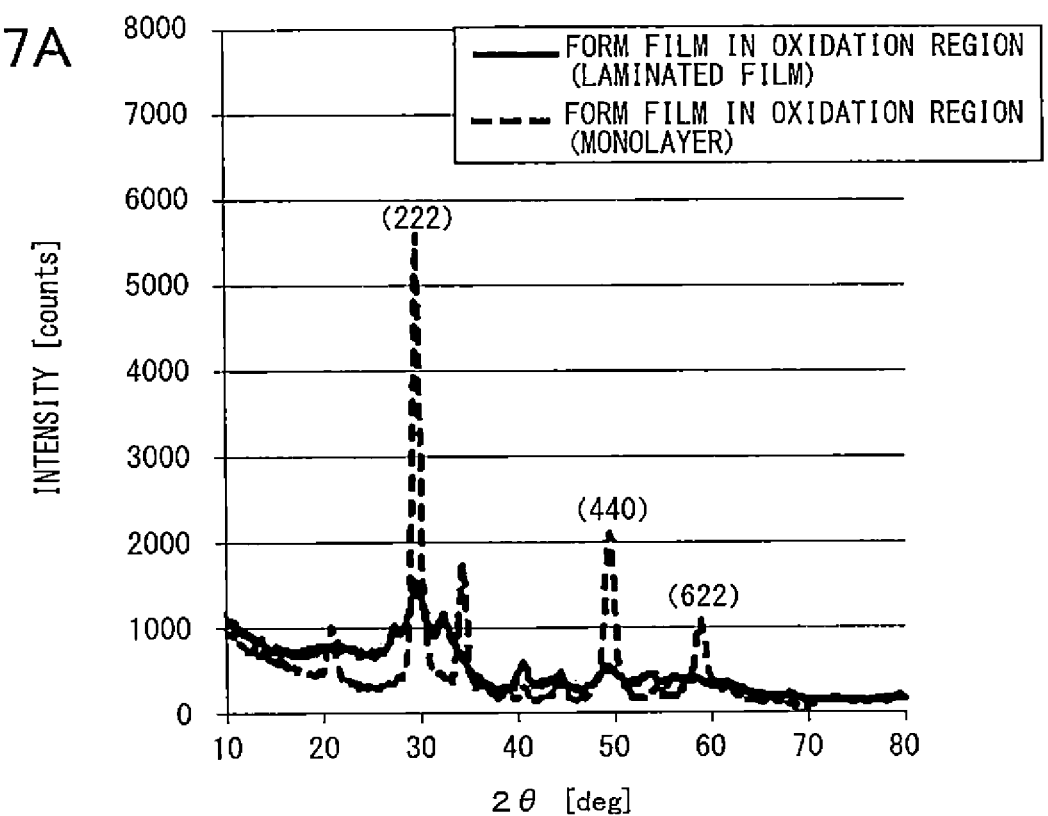
FIG. 7A is a chart indicating X-ray diffraction measurement results of the optical thin film of the first embodiment and a monolayer film formed in an oxidation region.
Figure 7B:
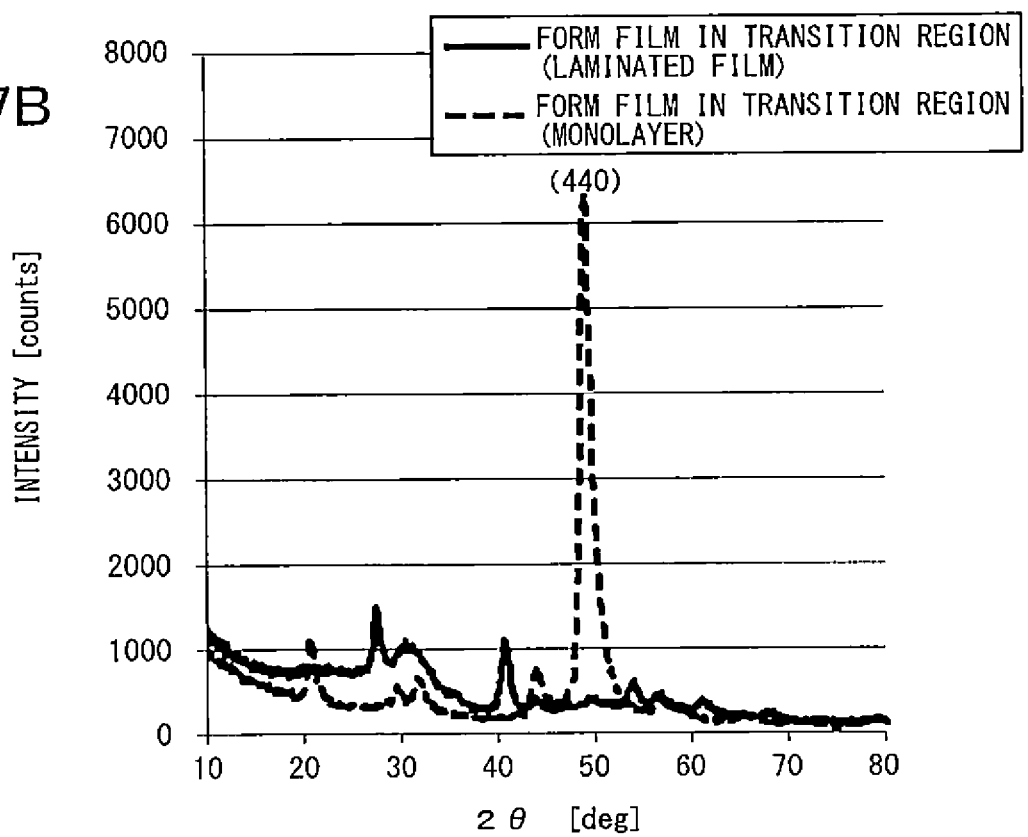
FIG. 7B is a chart indicating X-ray diffraction measurement results of the optical thin film of the second embodiment and a monolayer film formed in an transition region.

FIGS. 7A and 7B are charts indicating results of the X-ray diffraction. FIG. 7A indicates a case where the ytterbium oxide layer is formed in the oxidation region, and FIG. 7B indicates a case where the ytterbium oxide layer is formed in the transition region. Axes of abscissa of the charts represent angles, and axes of ordinate represent intensities of X-ray reflection. The charts indicate measurement results of the multilayer films of the embodiment and the monolayer film samples, respectively.

In the case where the film is formed in the oxidation region, peaks exist at the same position in the multilayer film of the first embodiment and in the monolayer film sample as illustrated in FIG. 7A. A reason why peaks observed in the multilayer film are small as compared to those of the monolayer film sample is that a film thickness of the ytterbium oxide layer within the multilayer film is thin as compared to that of the monolayer film sample besides diffraction of other materials composing the multilayer film. Noticing on an orientation plane of the ytterbium oxide crystal, it can be seen that both the multilayer film of the first embodiment and the monolayer film sample have a relationship of (222)>(440)>(622) in terms of heights of diffraction peaks of the respective planes (222), (440) and (622). It is more preferable if the heights of the diffraction peaks of the respective planes (222), (440) and (622) make a ratio of 6:2:1. This indicates that if the film is formed in the oxidation region, ytterbium oxide has characteristics of having no specific orientation.

Meanwhile, in the case where the film is formed in the transition region, peaks of the multilayer film of the second embodiment is small as compared to the monolayer film sample similarly to the case of the oxidation region as indicated in FIG. 7B. On the other hand, in a case where the film is formed in the transition region, ways how peaks appear are different in the monolayer film sample and in the multilayer film of the second embodiment.

It can be seen that the monolayer film sample has an orientation in a specific direction of (440) because the peak is strong only in (440). However, no remarkable feature is seen from the diffraction of the multilayer film. Although it is assumed that the multilayer film also has orientations in the same specific directions with those the monolayer film, it is considered that the orientations cannot be fully detected because the ytterbium oxide layer within the multilayer film is thin.

In terms of a relationship between the diffraction peak and the absorption, it is considered that grating of a surface layer of $Yb_2O_3$ is distorted and is changed to an electronic state of absorbing energy of a visible light wavelength region by reactions with F radicals and energy in forming the film of $MgF_2$ in the layer of $Yb_2O_3$ oriented to (440).

As described above, the multilayer film of the first embodiment including the ytterbium oxide layer formed in the oxidation region as the base of the magnesium fluoride layer has low optical absorption and excels in the optical performance. According to the X-ray diffraction measurement, the ytterbium oxide layer of the first embodiment has the relationship of (222)>(440)>(622) in terms of the heights of the diffraction peaks of the planes (222), (440) and (622) which is the orientation intrinsic to ytterbium oxide. It is more preferable if the heights of the diffraction peaks of the respective planes (222), (440) and (622) make a ratio of 6:2:1.

Figure 8A:
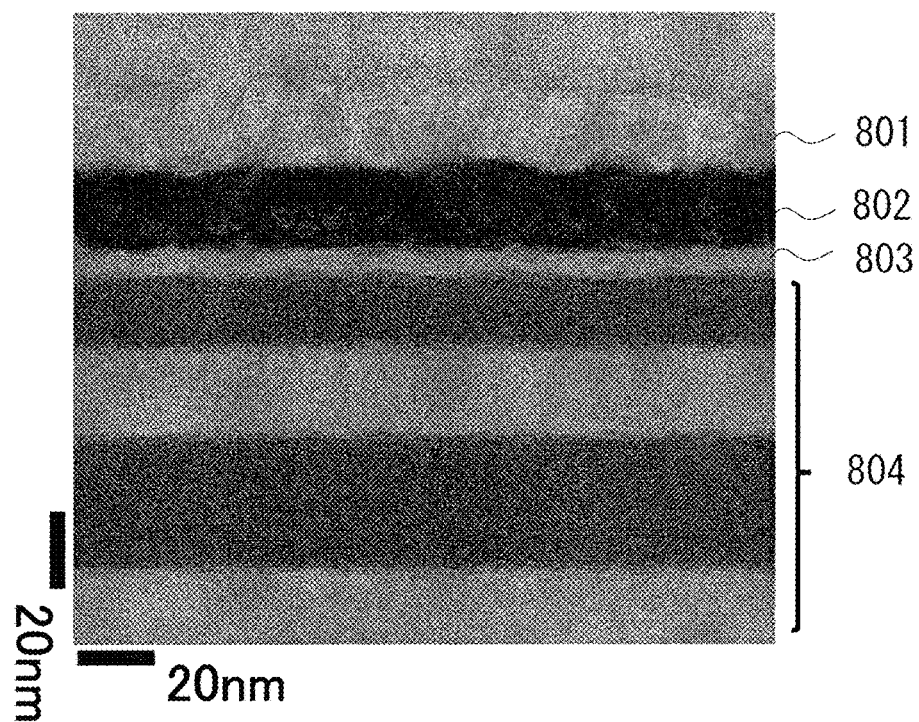
FIG. 8A is a photograph of a transmission electron microscope showing a section of the optical thin film of the first embodiment.
Figure 8B:
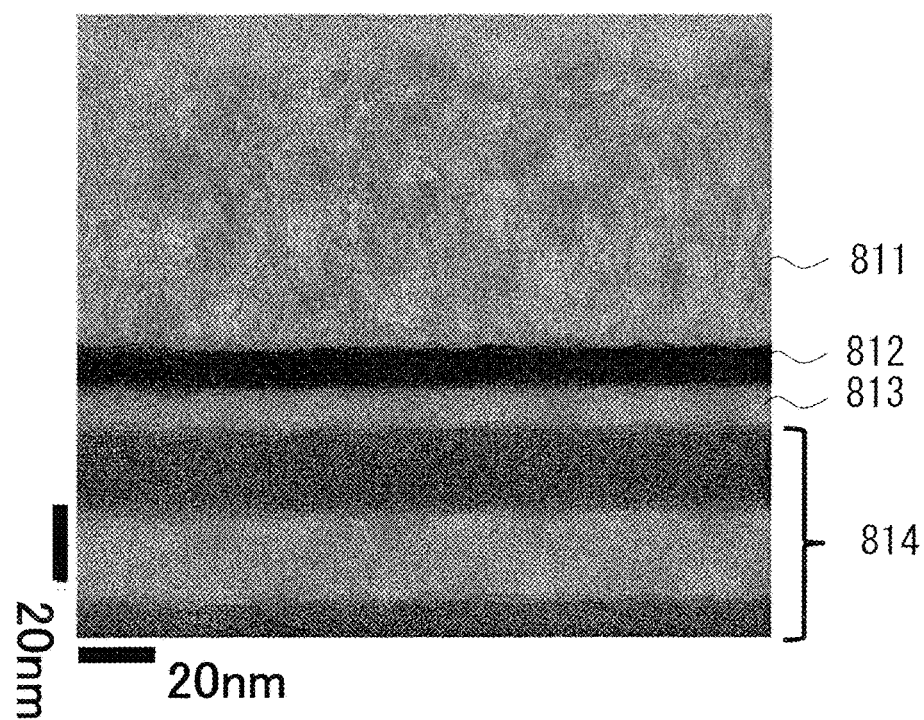
FIG. 8B is a photograph of a transmission electron microscope showing a section of the optical thin film of the second embodiment.

Next, FIGS. 8A and 8B show results of sections of the films observed by the transmission electron microscope. FIG. 8A is a case of the first embodiment in which the ytterbium oxide layer 402 is formed in the oxidation region, and FIG. 8B is a case of the second embodiment in which the ytterbium oxide layer 402 is formed in the transition region.

As illustrated in FIG. 8A, a crystal grain boundary is observed in an ytterbium oxide layer 802 formed in the oxidation region. As a result of the section observed by the transmission electronic microscope, grain sizes are from 3 nm to 15 nm. Accordingly, an interface between the magnesium fluoride layer 801 and the silicon oxide layer 803 is also roughened and a PV value indicating the roughness, i.e., a difference between a peak and a valley, was 6 nm or more.

Meanwhile, a section of a ytterbium oxide layer 812 formed in the transition region is highly uniform by the observation of the transmission electronic microscope and almost no crystal grain boundary is observed or its size is very small even if the grain boundary is observed as shown in FIG. 8B. Accordingly, the PV value of the interface between the magnesium fluoride layer 811 and the silicon oxide layer 813 is 2 nm or less and is highly flat.

As described above, while the multilayer film containing the ytterbium oxide layer formed in the oxidation region has the low optical absorption and excels in the optical performance, the crystal grain boundary is included in the ytterbium oxide layer, and the grain sizes are from 3 nm to 15 nm when the section was observed by the transmission electronic microscope.

Third Embodiment

In a third embodiment, the film-forming apparatus is controlled so as to start the film-forming process in the transition region and to switch to the oxidation region on a way of the process and to finish the film-forming process in order to enhance controllability of a thickness in forming the ytterbium oxide layer by the sputtering process. The conditions in forming the film in the transition region are the same with those described in the second embodiment, and the conditions in forming the film in the oxidation region are the same with those described in the first embodiment. That is, the rate of oxygen gas was increased to shift from the transition region to the oxidation region during the sputtering process.

If the layer is formed only in the oxidation region, crystals of certain large grain size exist as shown in FIG. 8A. Although there is a case where crystal grains intrude into adjacent upper and lower layers if crystals of large grain size exist, the film thickness of the silicon oxide layer of the base is set to be 20 nm or less in particular as described in the first embodiment. Accordingly, if the crystal grains of ytterbium oxide intrude into the silicon oxide layer, the film thickness diverts from the set value, possibly lowering the antireflection performance.

Then, if the film-formation process of the ytterbium oxide layer is started in the transition region, growth of the crystal grains around the interface with the base is suppressed. Therefore, the interface of the ytterbium oxide layer with the silicon oxide layer becomes flat and the base layer is barely intruded.

Meanwhile, it is preferable to finish the film-formation process of the ytterbium oxide layer in the oxidation region in order to suppress the optical absorption from occurring at the interface with the magnesium fluoride layer of the upper layer formed by the sputtering process. Then, the film-forming process of the ytterbium oxide layer is controlled so as to start in the transition region and to switch to the oxidation region on a way of the process and to finish the process in the oxidation region.

Figure 9:
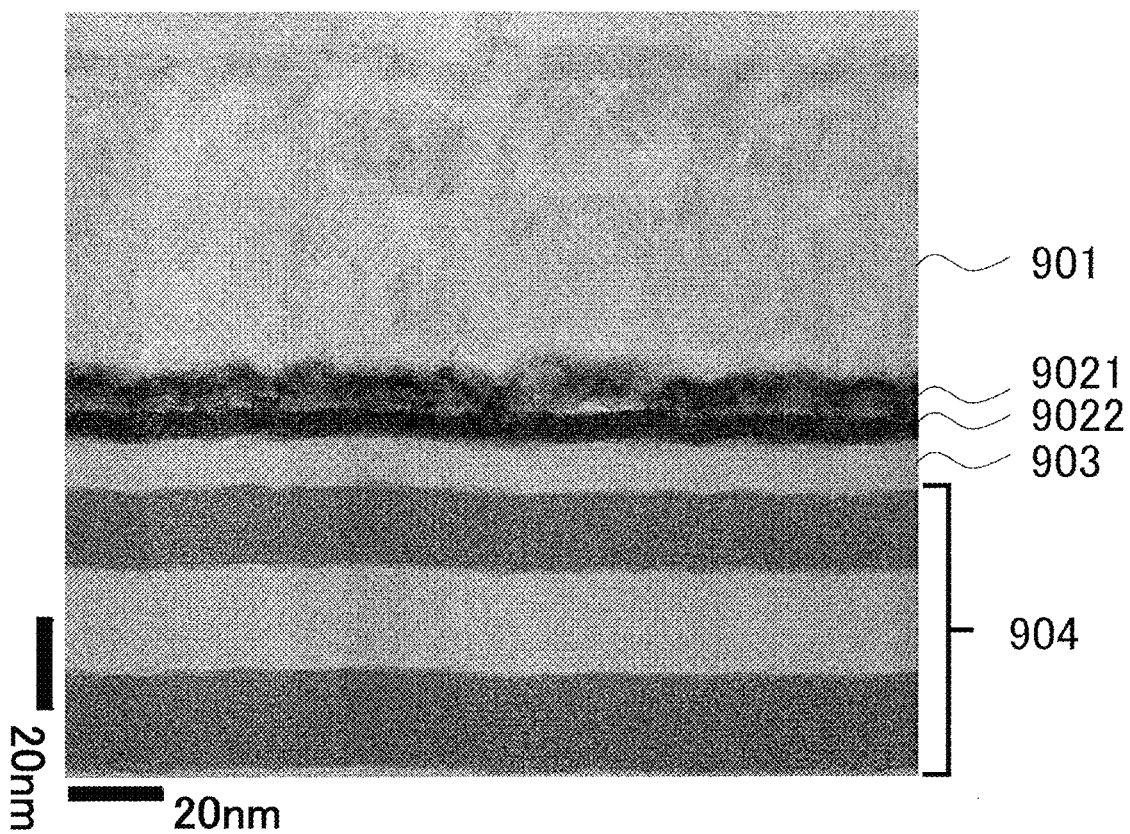
FIG. 9 is a photograph of a transmission electron microscope showing a section of an optical thin film of a third embodiment.

FIG. 9 shows a part of a result, i.e., a section of the multilayer film of the third embodiment, observed by the transmission electron microscope. As illustrated in FIG. 9, the multilayer film includes a magnesium fluoride layer 901, a part 9022 in which ytterbium oxide is formed in the transition region, a part 9021 in which ytterbium oxide is formed in the oxidation region, a silicon oxide layer 903 and an alternating layer 904. It can be seen that crystal grain size on a side closer to the magnesium fluoride layer 901 among the ytterbium oxide layers composed of the parts 9021 and 9022 is larger than the crystal grain size on a side closer to the base substrate.

Still further, as shown in FIG. 9, an interface between the part 9022 in which ytterbium oxide is formed in the transition region and the silicon oxide layer 903 assures flatness of 2 nm or less of PV value according to observation of a cross section conducted by using the transmission electronic microscope.

As a result, a thickness of the silicon oxide layer 903 is highly uniform. That is, roughness of the interface between the ytterbium oxide layer and the silicon oxide layer is smaller than the roughness of the interface between the ytterbium oxide layer and the magnesium fluoride layer.

While the interface with the part 9021 in which the ytterbium oxide layer is formed in the oxidation region and the magnesium fluoride layer 901 is as rough as 6 nm or more in terms of the PV value, it is not a problem because a thickness of the magnesium fluoride layer is fully large. Because a possibility of causing grating defects of ytterbium oxide around the interface is small in forming the magnesium fluoride layer, the optical absorption is suppressed.

While the film-forming condition of the ytterbium oxide layer has been changed once in shifting from the transition region to the oxidation region in the present embodiment, the condition may be changed by dividing into multiple steps or may be shifted by continuously changing the conditions. In such a case, there is a case where no clear boundary is observed even if the section is observed by the transmission electronic microscope.

Table 2 indicates layered configuration of films A and B which are two concrete examples of the third embodiment. The films A and B as illustrated in Table 2 are different in terms of thicknesses of the ytterbium oxide layer 9021 formed in the oxidation region and of the ytterbium oxide layer 9022 formed in the transition region.

TABLE 2

| LAYER | MATERIAL | FILM A THICKNESS [nm] | FILM B THICKNESS [nm] |
|---|---|---|---|
| 901 | MAGNESIUM FLUORIDE | 70 | 70 |
| 9021 | YTTERBIUM OXIDE (FORM FILM IN OXIDATION REGION) | 3 | 5 |
| 9022 | YTTERBIUM OXIDE (FORM FILM IN TRANSITION REGION) | 12 | 10 |
| 903 | SILICON OXIDE | 10 | 10 |
| 904 | NIOBIUM OXIDE | 28 | 28 |
|  | SILICON OXIDE | 23 | 23 |
|  | NIOBIUM OXIDE | 36 | 36 |
|  | SILICON OXIDE | 42 | 42 |
|  | NIOBIUM OXIDE | 11 | 11 |
| 900 | SYNTHETIC SILICA | BASE SUBSTRATE | BASE SUBSTRATE |

Because film-forming speed is fast in the transition region, the higher the rate formed in the transition region, the shorter a time required for manufacturing the whole film becomes, thus increasing productivity. However, the thickness of the layer formed in the oxidation region is required to be 3 nm or more in order to suppress the optical absorption at the interface with the magnesium fluoride layer 901. Still further, because it is necessary to suppress the thickness of the ytterbium oxide layer within 15 nm as described in the first embodiment, it is preferable to set a total thickness of the ytterbium oxide layers 9021 and 9022 to be 15 nm or less.

Figure 10:
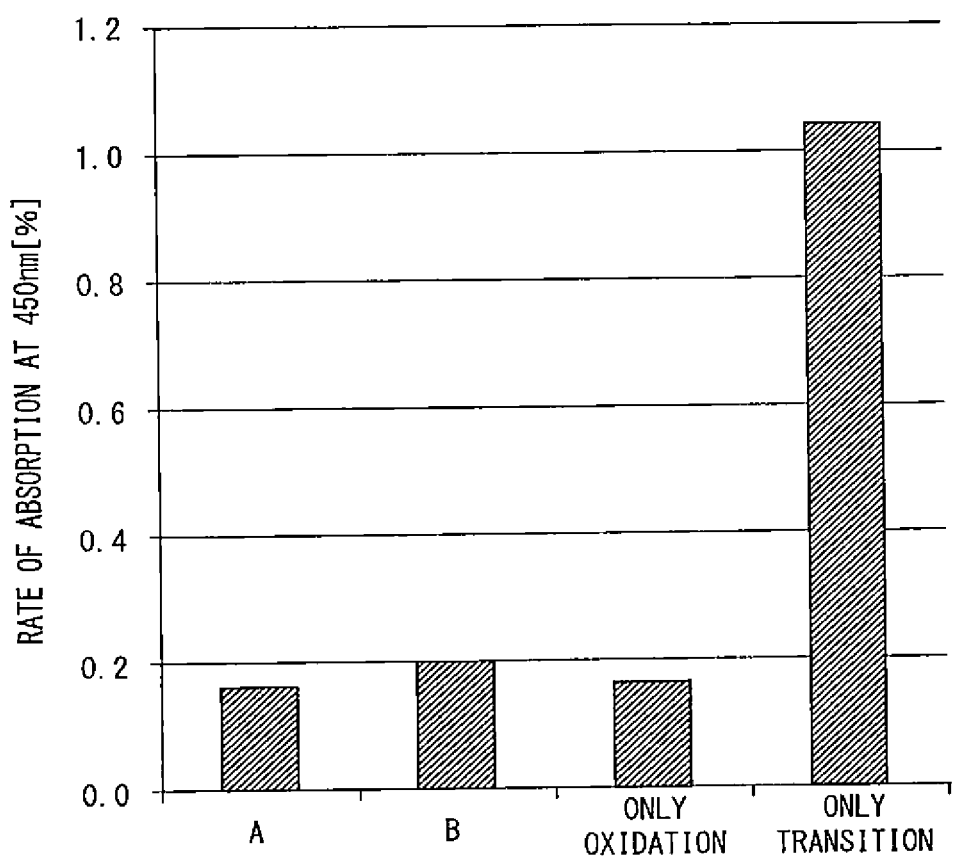
FIG. 10 is a bar graph indicating absorptance in exemplary film configurations.

FIG. 10 is a bar graph indicating optical absorptance at 450 nm of wavelength of the multilayer film of the first embodiment, the multilayer film of the second embodiment, and films A and B of the third embodiment. The films A and B of the third embodiment have less optical absorptance and favorable optical characteristics similarly to the first embodiment formed only in the oxidation region.

Embodiments of the present disclosure are not limited to those embodiments described above, and a number of layers of the multilayer film, a thickness, materials, film-forming conditions and the like for example may be appropriately modified.

While the magnesium fluoride, i.e., the low refractive index material, has been used in the embodiment of the present disclosure, it is possible to realize the optical thin film whose optical absorption around the interface with the high refractive index material of the base is suppressed and having high durability under a high-temperature and high-humidity environment.

It is also possible to provide an optical element that excels in the antireflection characteristics and durability by providing such optical thin film on the base substrate.

Other Embodiments

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-084808, filed Apr. 21, 2017, which is hereby incorporated by reference wherein in its entirety.

What is claimed is:

1. An optical thin film provided on a base substrate, comprising:
    an alternating layer in which high refractive index layers and low refractive index layers are alternately laminated, the alternating layer being disposed on the base substrate;
    a layer whose main component is a silicon compound disposed on the alternating layer;
    a layer whose main component is ytterbium oxide disposed on the layer whose main component is the silicon compound; and
    a layer whose main component is magnesium fluoride disposed on, and is in contact with, the layer whose main component is ytterbium oxide.

2. The optical thin film according to claim 1, wherein a thickness of the layer whose main component is ytterbium oxide is 3 to 15 nm.

3. The optical thin film according to claim 1, wherein the layer whose main component is ytterbium oxide has diffraction peaks measured by X-ray diffraction are high in an order of (222), (440) and (622) in terms of orientations (222), (440) and (622) intrinsic to ytterbium oxide.

4. The optical thin film according to claim 1, wherein roughness of an interface between the layer whose main component is ytterbium oxide and the layer whose main component is silicon compound is smaller than roughness of an interface between the layer whose main component is ytterbium oxide and the layer whose main component is magnesium fluoride.

5. The optical thin film according to claim 1, wherein a crystal grain size on a side closer to the layer whose main component is magnesium fluoride is larger than a crystal grain size on a side closer to the layer whose main component is the silicon compound in the layer whose main component is ytterbium oxide.

6. The optical thin film according to claim 1, wherein the layer whose main component is magnesium fluoride and the layer whose main component is ytterbium oxide contain argon.

7. The optical thin film according to claim 1, wherein the high refractive index layers contain a material selected from the group consisting of zirconium oxide, tantalum oxide, niobium oxide, titanium oxide, silicon nitride, and silicon oxynitride, and
    wherein the low refractive index layers contain a material selected from the group consisting of silicon oxide, silicon oxynitride, and aluminum oxide.

8. The optical thin film according to claim 1, wherein an uppermost layer of the alternating layer is one of the high refractive index layers, which is in contact with the layer whose main component is the silicon compound.

9. The optical thin film according to claim 1, wherein the silicon compound is silicon oxide, and the low refractive index layers are silicon oxide layers.

10. An optical element comprising:
    a base substrate; and
    the optical thin film as set forth in claim 1, provided on the base substrate.

11. A manufacturing method of an optical element in which a multilayer film is provided on a base substrate, comprising:
    forming an alternating layer, by a sputtering process, in which high refractive index layers and low refractive index layers are alternately laminated;
    forming a layer whose main component is a silicon compound by a sputtering process on the alternating layer;
    forming a layer whose main component is ytterbium oxide by a sputtering process on the layer whose main component is the silicon compound; and
    forming a layer whose main component is magnesium fluoride by a sputtering process on the layer whose main component is ytterbium oxide so that the layer whose main component is magnesium fluoride is in contact with the layer whose main component is ytterbium oxide.

12. The manufacturing method of the optical element according to claim 11, wherein a rate of oxygen to gases introduced into a chamber during the sputtering process is increased in the forming of the layer whose main component is ytterbium oxide.

13. The manufacturing method of the optical element according to claim 11, wherein a region is shifted from a transition region to an oxidation region by controlling a rate of oxygen to gases introduced into a chamber during the sputtering process in the forming of the layer whose main component is ytterbium oxide.

14. The manufacturing method of the optical element according to claim 11, wherein each of the high refractive index layers contains a material selected from the group consisting of zirconium oxide, tantalum oxide, niobium oxide, titanium oxide, silicon nitride, and silicon oxynitride, and
    wherein each of the low refractive index layers contains a material selected from the group consisting of silicon oxide, silicon oxinitride, and aluminum oxide.

15. The manufacturing method of the optical element according to claim 11, wherein in the forming of the alternating layer, one of the high refractive index layers is laminated on the base substrate, and another one of the high refractive index layers is laminated as an uppermost layer of the alternating layer.

16. The manufacturing method of the optical element according to claim 11, wherein the silicon compound is silicon oxide, and the low refractive index layers are silicon oxide layers.

* * * * *